(12) United States Patent
Chung

(10) Patent No.: US 8,049,284 B2
(45) Date of Patent: Nov. 1, 2011

(54) BIPOLAR DEVICE COMPATIBLE WITH CMOS PROCESS TECHNOLOGY

(75) Inventor: Shine Chung, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 75 days.

(21) Appl. No.: 12/752,431

(22) Filed: Apr. 1, 2010

(65) Prior Publication Data
US 2010/0187637 A1 Jul. 29, 2010

Related U.S. Application Data

(62) Division of application No. 11/075,141, filed on Mar. 7, 2005, now Pat. No. 7,723,803.

(51) Int. Cl.
*H01L 29/739* (2006.01)
(52) U.S. Cl. .................. 257/378; 257/E27.017
(58) Field of Classification Search .......... 257/370, 257/378, E27.15, E27.17
See application file for complete search history.

(56) References Cited

U.S. PATENT DOCUMENTS

| | | | | |
|---|---|---|---|---|
| 4,016,594 A * | 4/1977 | Shappir | | 257/370 |
| 4,120,707 A | 10/1978 | Beason | | |
| 5,376,816 A * | 12/1994 | Nishigoori et al. | | 257/370 |
| 5,416,031 A | 5/1995 | Miwa | | |
| 5,581,103 A * | 12/1996 | Mizukami | | 257/355 |
| 5,614,424 A | 3/1997 | Wong et al. | | |
| 5,631,483 A * | 5/1997 | Ferla et al. | | 257/341 |
| 5,648,279 A * | 7/1997 | Imai | | 438/202 |
| 5,666,001 A | 9/1997 | Miwa | | |
| 5,717,241 A * | 2/1998 | Malhi et al. | | 257/378 |
| 6,124,618 A * | 9/2000 | Wong et al. | | 257/370 |
| 6,137,146 A | 10/2000 | Manning | | |
| 6,249,031 B1 | 6/2001 | Verma et al. | | |
| 6,399,990 B1 | 6/2002 | Brennan et al. | | |
| 6,429,491 B1 * | 8/2002 | Schnaitter | | 257/362 |
| 6,455,902 B1 | 9/2002 | Voldman | | |
| 2003/0197226 A1 | 10/2003 | Chen et al. | | |
| 2004/0256678 A1 | 12/2004 | Goshiima et al. | | |
| 2010/0032766 A1* | 2/2010 | Chen et al. | | 257/370 |

FOREIGN PATENT DOCUMENTS

| | | | |
|---|---|---|---|
| JP | 02294063 | | 12/1990 |
| JP | 04018763 A | * | 1/1992 |
| JP | 04225238 | | 8/1992 |

(Continued)

OTHER PUBLICATIONS

Tamba, A. et al., CMOS-Compatible Lateral Bipolar Transistor for BiCMOS Technology: Part II—Experimental Results, IEEE Transactions on Electron Devices, Aug. 1992, 39(8):1865-1869, (in U.S. Appl. No. 11/075,141).

(Continued)

*Primary Examiner* — Allan R Wilson
(74) *Attorney, Agent, or Firm* — Duane Morris LLP

(57) ABSTRACT

The present invention discloses a bipolar device. An emitter is formed in a semiconductor substrate. A collector is laterally spaced from the emitter in the substrate. A gate terminal is formed on the substrate, defining a space between the emitter and the collector. An extrinsic base is formed on the substrate with a predetermined distance from either the emitter or the collector, wherein the base, the emitter, the collector and the gate terminal are located in an active area defined by a hole in a surrounding isolation structure in the substrate.

7 Claims, 7 Drawing Sheets

FOREIGN PATENT DOCUMENTS

| | | |
|---|---|---|
| JP | 06120431 | 4/1994 |
| JP | 09213708 | 8/1997 |

OTHER PUBLICATIONS

Verdonckt-Vandebroek, S. et al., "High-Gain Lateral Bipolar Action in a MOSFET Structure", IEEE Transactions on Electron Devices, Nov. 1991, 38(11):2487-2496, (in U.S. Appl. No. 11/075,141).

Au, K.K. et al., "Field-Plated High Gain Lateral Bipolar Transistor in Standard CMOS Process for BiNMOS Application", IEEE Custom Integrated Circuits Conference, 1991, 4 pages, (in U.S. Appl. No. 11/075,141).

Feb. 22, 2010 Office Action issued by Japanese Patent Office with translation, Patent App. No. 2006-061615.

* cited by examiner

BIPOLAR DEVICE COMPATIBLE WITH CMOS PROCESS TECHNOLOGY

CROSS-REFERENCE TO RELATED APPLICATION

This application is a divisional patent application of U.S. patent application Ser. No. 11/075,141 filed Mar. 7, 2005, now U.S. Pat. No. 7,723,803, the entirety of which is hereby incorporated by reference herein.

BACKGROUND

The present invention generally relates to a Complementary Metal Oxide Semiconductor (CMOS) process technology, and more particularly to a bipolar device with improved performance and built by standard CMOS processes.

While CMOS devices have advantages of low power consumption and high tolerance to noise, they often need some specially designed I/O devices and circuits to protect them from high voltage signals. Those I/O devices and circuits usually require extra masks in the course of semiconductor processing. One way to simplify such semiconductor processing is to use bipolar devices, such as bipolar transistors, as the I/O devices. The bipolar devices are able to sustain higher voltage, and easy to manufacture while fully compatible with conventional CMOS process technologies. In addition, bipolar devices have many advantages than CMOS in building analog circuitry. It would be desirable to use bipolar devices together with CMOS devices in certain circuits to achieve a better performance with no additional cost.

FIGS. 1 and 2 illustrate a conventional PNP bipolar transistor 10 compatible with CMOS process technologies. The LOCal Oxidation of Silicon (LOCOS) isolations 11 define three active areas 12, 13 and 14 on N well 15 in a semiconductor substrate. The active areas 12 and 13 doped with P-type impurities form an emitter 16 and collector 17, respectively. The LOCOS isolation 11 between the emitter 16 and collector 17 defines an intrinsic base 18 thereunder in the N well 15. An extrinsic base 19 is electrically connected to the intrinsic base 18 via the body of the N well 15. The extrinsic based 19 is doped with N type of impurities to improve its conductivity. When the emitter 16, collector 17 and extrinsic base 19 are properly biased, carriers would flow between the emitter 16 and the collector 17 to result in amplifications.

The performance of the PNP bipolar transistor 10 greatly depends on the electrical characteristics of the width in intrinsic base 18 and the spacing to the extrinsic base 19. Conventionally, its current gain β, about 4-10, is too small to make a practical use of the bipolar transistor 10. Furthermore, if a Shallow Trench Isolations (STI) instead of a LOCOS isolation is used, it is almost impossible for carriers to travel between the collector and emitter over the STI. This further degrades the bipolar transistor's performance.

What is needed is a bipolar device compatible with CMOS technology that has improved performance. If the width of a base is defined by a poly gate, rather than spaced by STI or LOCOS, the current gain can be very high in today's very deep submicron technologies. Moreover, if the collector and the extrinsic base are not isolated by shallow trench, the current can flow through from the extrinsic base to collector without any blockage.

SUMMARY

The present invention discloses a bipolar device. An emitter is formed in a semiconductor substrate. A collector is laterally spaced from the emitter in the substrate. A gate terminal is formed on the substrate, defining a space between the emitter and the collector. An extrinsic base is formed on the substrate with a predetermined distance from either the emitter or the collector, wherein the base, the emitter, the collector and the gate terminal are located in an active area defined by a surrounding isolation structure in the substrate.

As such, the invention provides a novel bipolar device having the advantages of improved performance, compatibility with CMOS technologies, compact layout, simplicity of processing and an additional terminal for modulating the device.

DESCRIPTION

An important factor contributing to the performance of a lateral bipolar transistor is reducing the base width and base resistance. On the one hand, it is desirable to form a base and a collector in the same active area, so that the current flow would not be blocked by isolations, such as STI and LOCOS. On the other hand, the base and collector shall not be so close to induce undesired capacitance at their P-N junction. In addition, the collector and the extrinsic base need to be prevented from shorting each other by the silicide formed on the surface in today's self-aligned silicide process. The present invention discloses a lateral bipolar device properly balances the relative locations of the base and collector in order to improve its performance.

Figure 1:
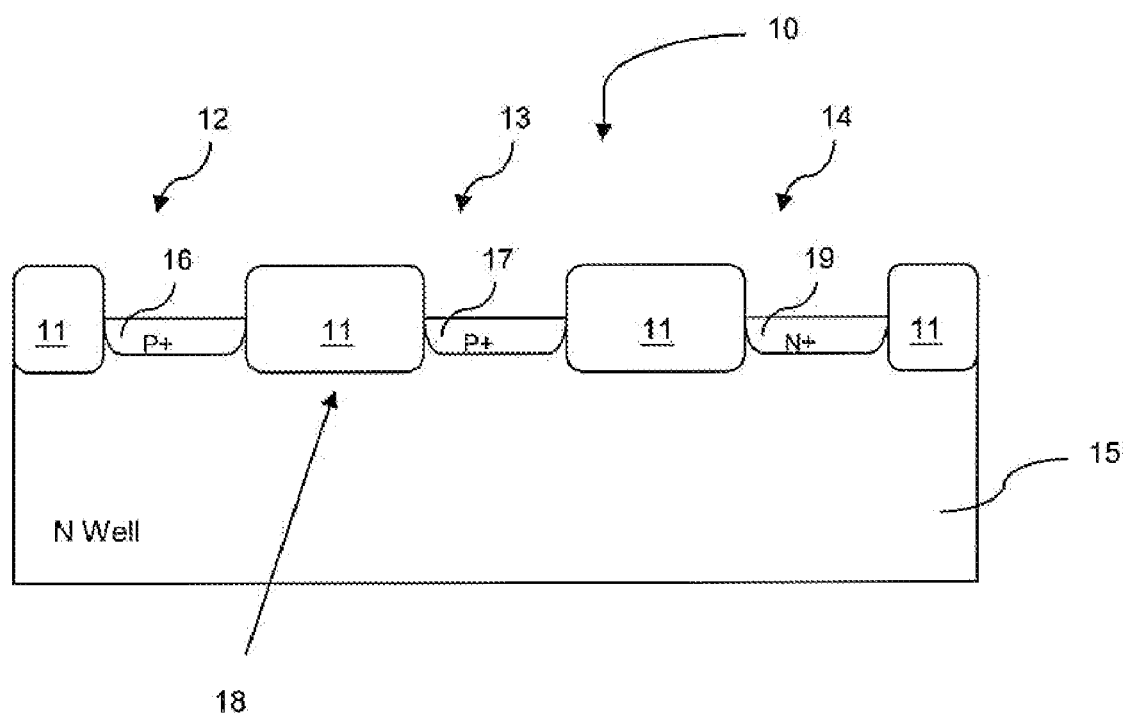
FIG. 1 illustrates a cross-sectional view of a conventional bipolar transistor.
Figure 2:
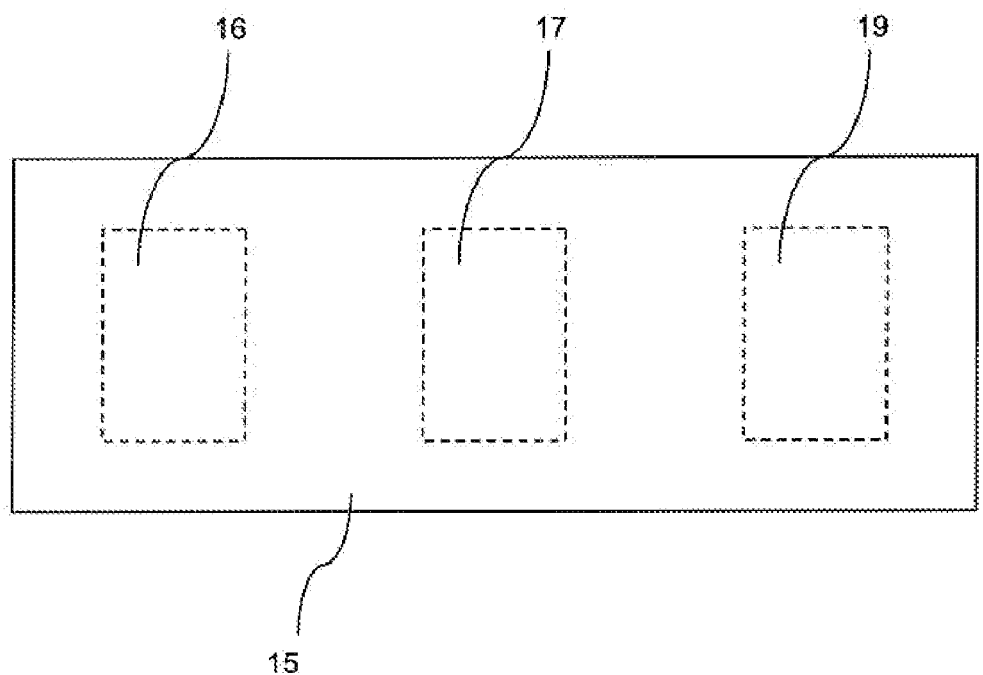
FIG. 2 illustrates a top view of the conventional lateral bipolar transistor as shown in FIG. 1.
Figure 3A:
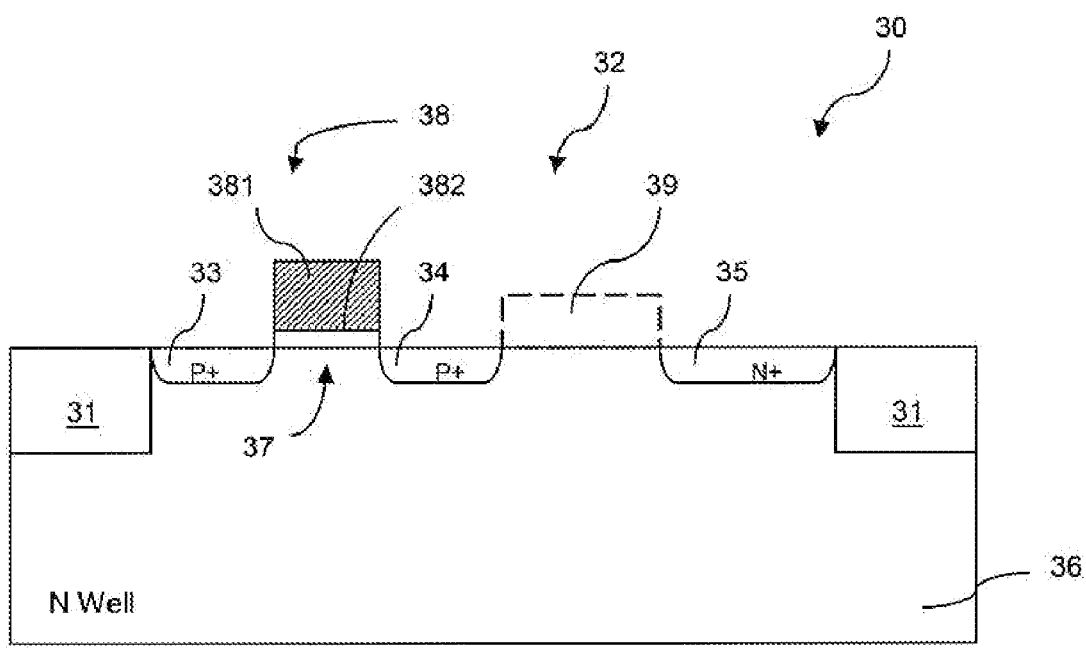
FIG. 3A illustrates a cross-sectional view of a bipolar device according to an embodiment of the invention.
Figure 3B:
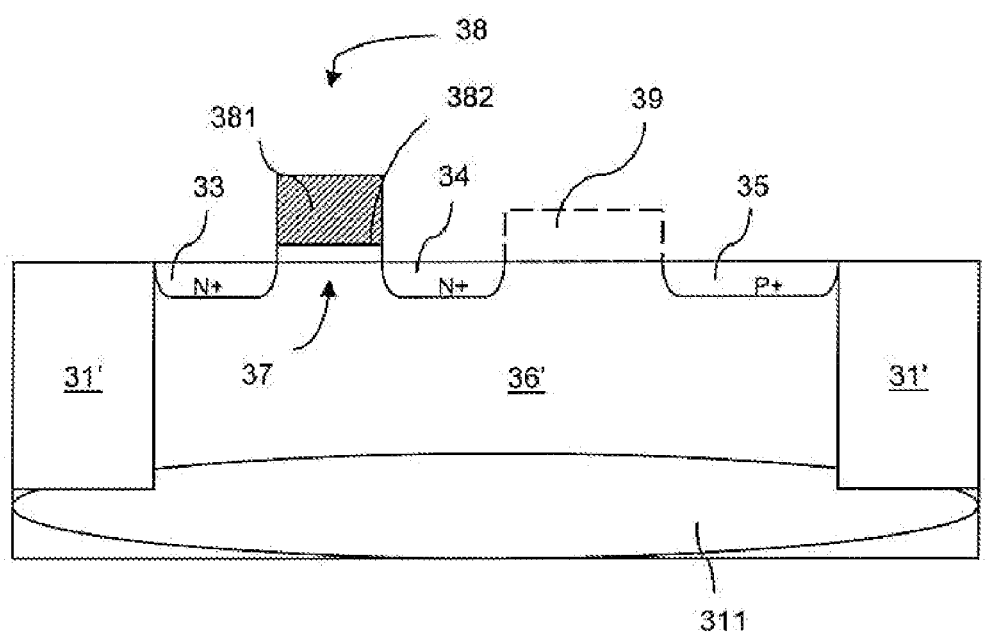
FIG. 3B illustrates a cross-sectional view of a bipolar device according to another embodiment of the invention.
Figure 4:
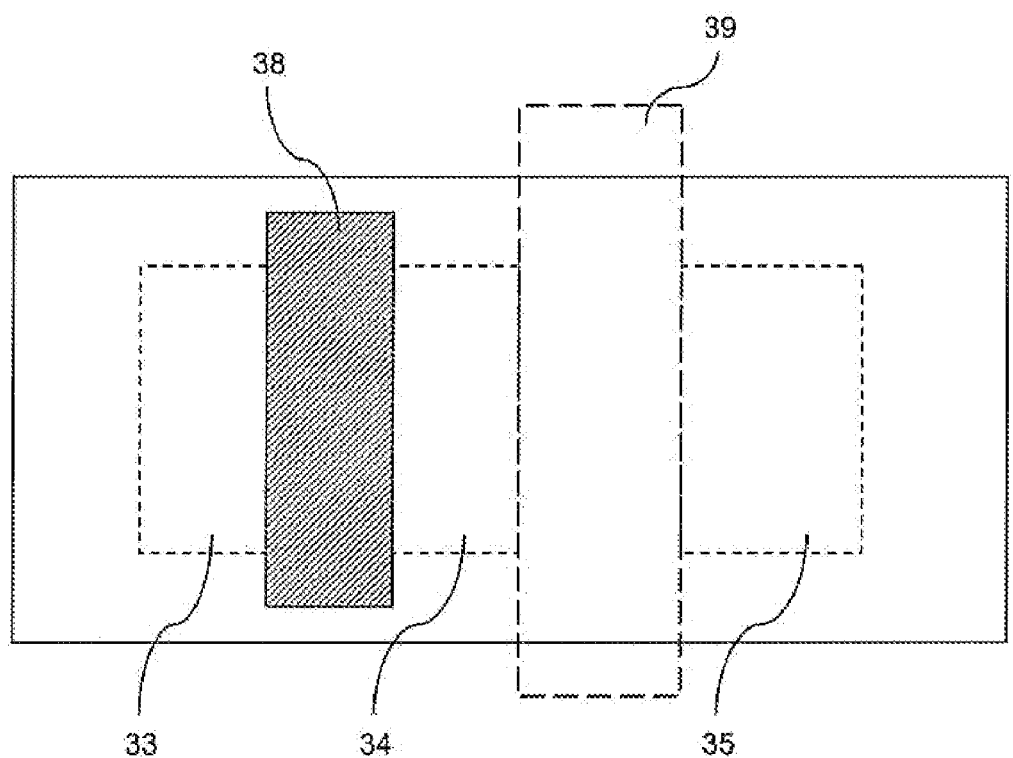
FIG. 4 illustrates a top view of the bipolar device according to the embodiment as shown in FIG. 3A.

FIGS. 3A, 3B, and 4 illustrate a lateral PNP bipolar device 30 according to a preferred embodiment of the present invention. FIG. 3A illustrates a PMOS version while FIG. 3B shows an NMOS NPN bipolar device. For illustration purposes, similar elements are referred to by similar numerals. As shown in FIG. 3A, a hole surrounded by STI 31 define an active area 32 where an emitter 33, collector 34 and extrinsic base 35 are formed on the N well 36 in a semiconductor substrate. [the STI froms a ring from two-dimensional view.] The extrinsic base 35 is formed on the substrate with a predetermined distance from either the emitter 33 or the collector 34. The intrinsic base 37 is defined under a gate 38 and between the emitter 33 and collector 34. An external bias may be applied to the intrinsic base 37 via the extrinsic base 35 and N well 36. The gate 38 includes a gate oxide 382 that separates the poly gate 381 from the N well 36. The gate 38 functions as an additional terminal to which a controlling voltage may be applied for modulating a voltage level of the intrinsic base 37. This embodiment has many applications in circuits such as in Voltage-Controlled Oscillator circuits. In essence, this device is a bipolar sharing its emitter, intrinsic base, and collector with source, gate, and drain of a PMOS, respectively.

The extrinsic base 35 and collector 34 are located in the same active area 32, so that there will not be any isolations, such as LOCOS and STI, blocking the current flowing therebetween. This significantly reduces the base resistance and improves the performance of the bipolar device 30.

As discussed above, if the extrinsic base 35 and collector 34 are too close, the capacitance between the two will increase, thereby adversely affecting their P-N junction. A sufficient distance between the extrinsic base 35 and collector 34 is desired to avoid such undesired increase of capacitance. It is suggested that the minimum distance should be sufficient to avoid the depletion regions of the two terminals from overlapping with one another, and it may be at least about 0.2-0.3 um. The collector and the extrinsic base also need to be separated for preventing the silicide on the top from shorting each other. A divider 39 is introduced on the N well 36 to define the distance between the extrinsic base 35 and collector 34. The divider 39 can be a layer of Resist Protection Oxide (RPO) or a dummy gate. A RPO is a mask that prevents a salicide formed on the top of a poly gate or an active area. A dummy gate has the same structure as a conventional gate, but has no functions such as turning on or off of a channel. In this embodiment, the divider 39 is a RPO that has a width sufficient to avoid an overlap between the depletion regions of the extrinsic base 35 and collector 34 and to break the silicide formation between them.

FIG. 4 is a top view of the layout of the device corresponding to FIG. 3A. Similar to FIG. 3A, FIG. 3B illustrates a NMOS NPN bipolar device. The difference is that instead of the N Well 36, there is a P substrate ("P-sub") 36' hosting the device. The P-region, where the base is built upon, is surrounded by an N-well ring 310 on each side, and is on top of a very deep N-well 311, which further is built on the P-substrate. Similar to PNP, the active region is also defined by a hole surrounded by STI.

Figure 5:
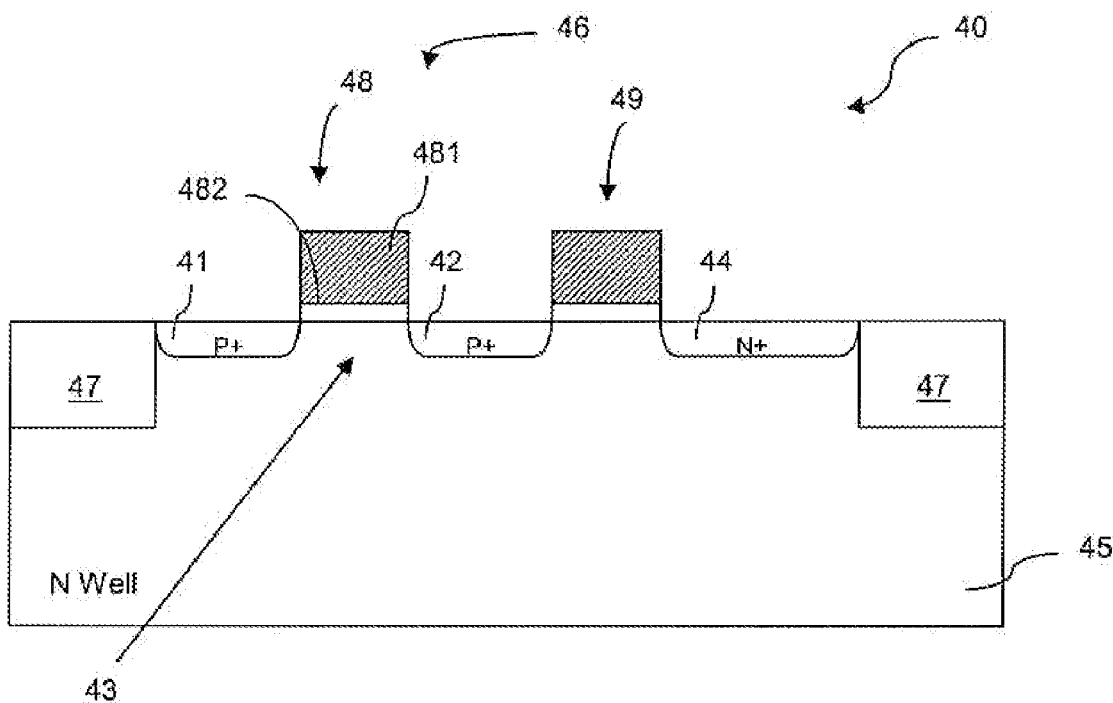
FIG. 5 illustrates a cross-sectional view of a bipolar device according to another embodiment of the invention.
Figure 6:
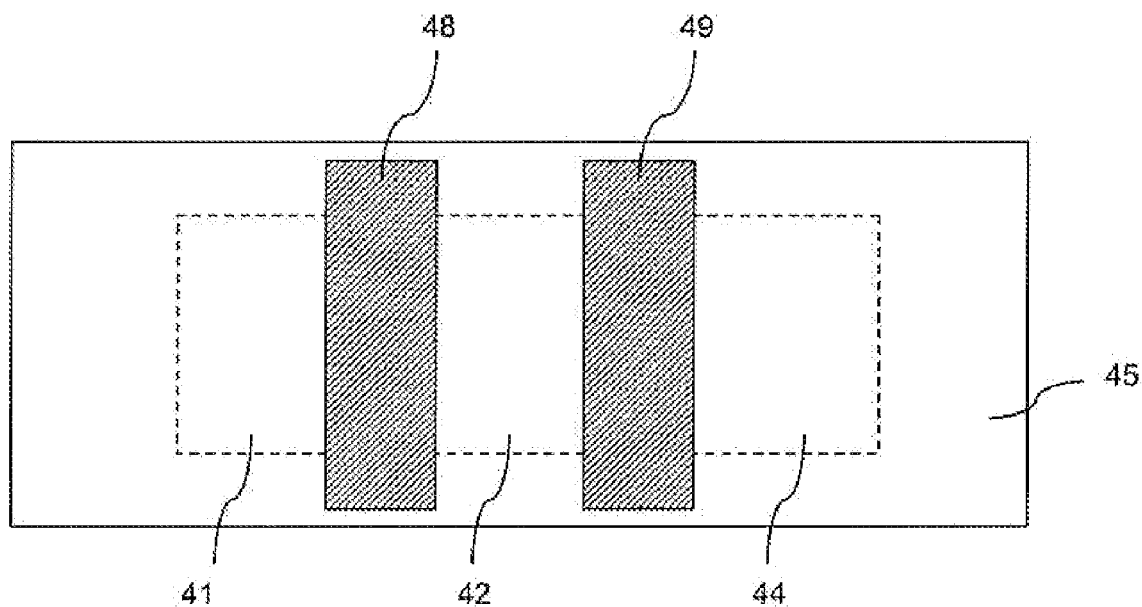
FIG. 6 illustrates a top view of the bipolar device according to the embodiment as shown in FIG. 5.

FIGS. 5 and 6, illustrate a lateral bipolar device 40 according to another embodiment of the present invention. The bipolar device 40 includes a P-type emitter 41, a P-type collector 42, an N-type intrinsic base 43, an N-type extrinsic base 44 formed within an active area 46 defined by a surrounding STI 47. The control gate 48 defines the width of the intrinsic base 43 that is formed between the emitter 41 and collector 42 in an N well 45. The gate oxide 482 separates the poly gate 481 from the N well 45. An external bias may be applied to the intrinsic base 43 via the extrinsic base 44 and the N well 45.

The dummy poly gate 49 defines the space between the extrinsic base 44 and collector 42. As discussed above, the space is suggested to be sufficiently narrow for avoiding an overlap of the depletion regions of the base 44 and collector 42. The dummy poly gate also prevents any silicide to be formed from the collector 42 to the extrinsic base 44. Similar to what is shown in FIG. 3B, one skilled in the art will understand that the NPN bipolar device can also be implemented using the same principles illustrated here.

The bipolar device as disclosed in the above embodiments are compatible with the current CMOS technologies. The divider can be formed in the normal process for forming a gate or salicide, without adding extra number of masks. In fact, because the disclosed bipolar devices can be operated at a voltage level higher than conventional CMOS devices, they are suitable for using as high voltage tolerant I/O devices. As discussed above, a conventional CMOS-based I/O device requires several extra masks in the course of manufacturing. Thus, the disclosed bipolar device is able to simplify the manufacturing processes by using fewer masks, if it is employed as the I/O devices. It is understood that the bipolar devices have many advantages in analog circuits.

The disclosed bipolar devices also resolve the issues of channel leakage and gate oxide breakdown. Conventionally, as the gate width of integrated circuits becomes narrow, the channel leakage and gate oxide breakdown become increasingly problematic for MOS devices. If the MOS devices consume as much standby current as in bipolar circuits, bipolar devices may be more favorable if the area and cost are comparable.

Furthermore, instead of the conventional three terminal bipolar device, the poly gate serves as an additional terminal to the disclosed bipolar device. A voltage level of the gate terminal can be adjusted so that the current flow among the emitter, collector and base can be modulated. As such, a four terminal device merging MOS device with bipolar device is formed. This feature is significant in that by controlling a voltage at the gate, the performance of the bipolar device can be altered. If this bipolar device is applied to certain circuit design (e.g., VCO circuits), it would allow an easy control of voltage values at a certain node in the circuit.

FIGS. 7 through 12 illustrate various embodiments of the disclosed bipolar devices, wherein the shapes of the dividers may vary, but their function of separating the base and collector remains the same. Note that the dividers can be either a RPO or dummy gate, which the following embodiments will simply refer as a divider.

Figure 7:
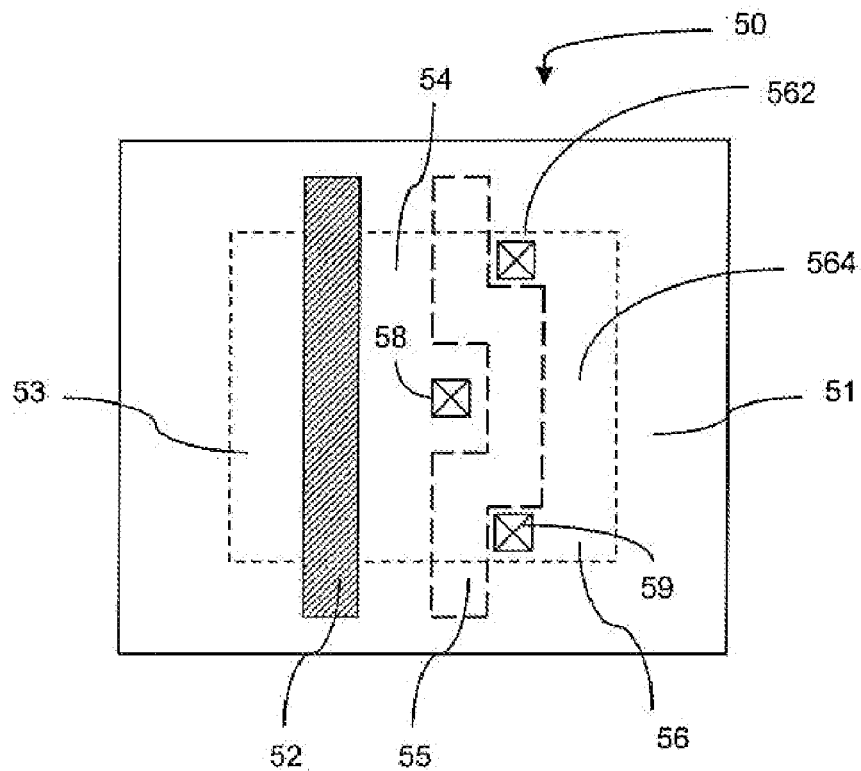
FIG. 7 illustrates a top view of a bipolar device according to another embodiment of the invention.

Referring to FIG. 7, according to an embodiment of the invention, a bipolar device is formed on an N well 51. The ploy gate 52 separates an emitter 53 and collector 54. An intrinsic base (not shown in this figure) runs underneath the poly gate 52 and between the emitter 53 and collector 54. The divider 55 separates the collector 54 and an extrinsic base 56 and has a "saddle" shape so that the edge portions 562 of the extrinsic base 56 are closer to the ploy gate 52 than its middle "recess" portion 564. The divider minimizes the width by placing one or more collector contacts 58 in the middle and extrinsic base contacts 59 on both ends.

Figure 8:
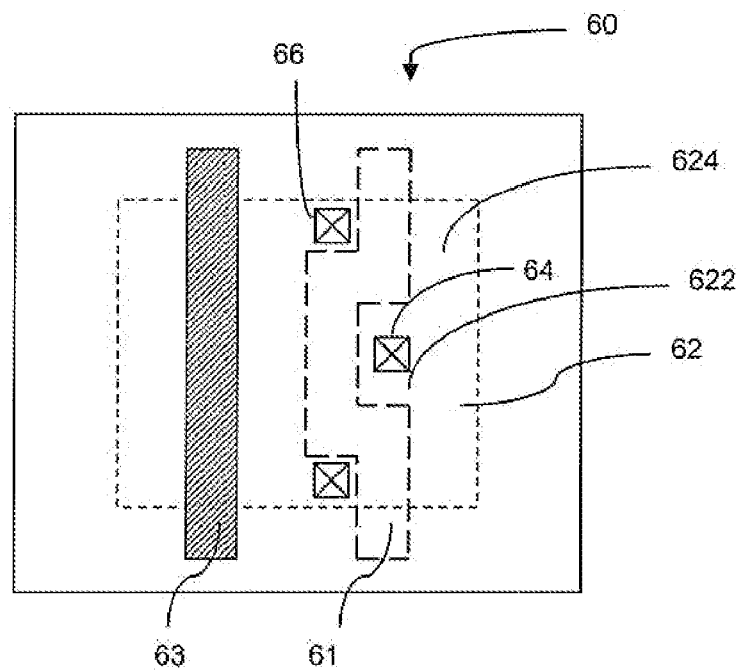
FIG. 8 illustrates a top view of a bipolar device according to another embodiment of the invention.

FIG. 8 illustrates a bipolar device 60, according to another embodiment of the present invention. The bipolar device 60 is substantially identical to that shown in FIG. 7, except that the shape of a divider 61 differs from the divider 55. Here, the middle portion 622 of the extrinsic base 62 is closer to the poly gate 63 than its edge portions 624. The "saddle" shaped divider minimizes the width by placing extrinsic base contacts 64 in the middle and the collector contacts 66 on both ends.

Figure 9:
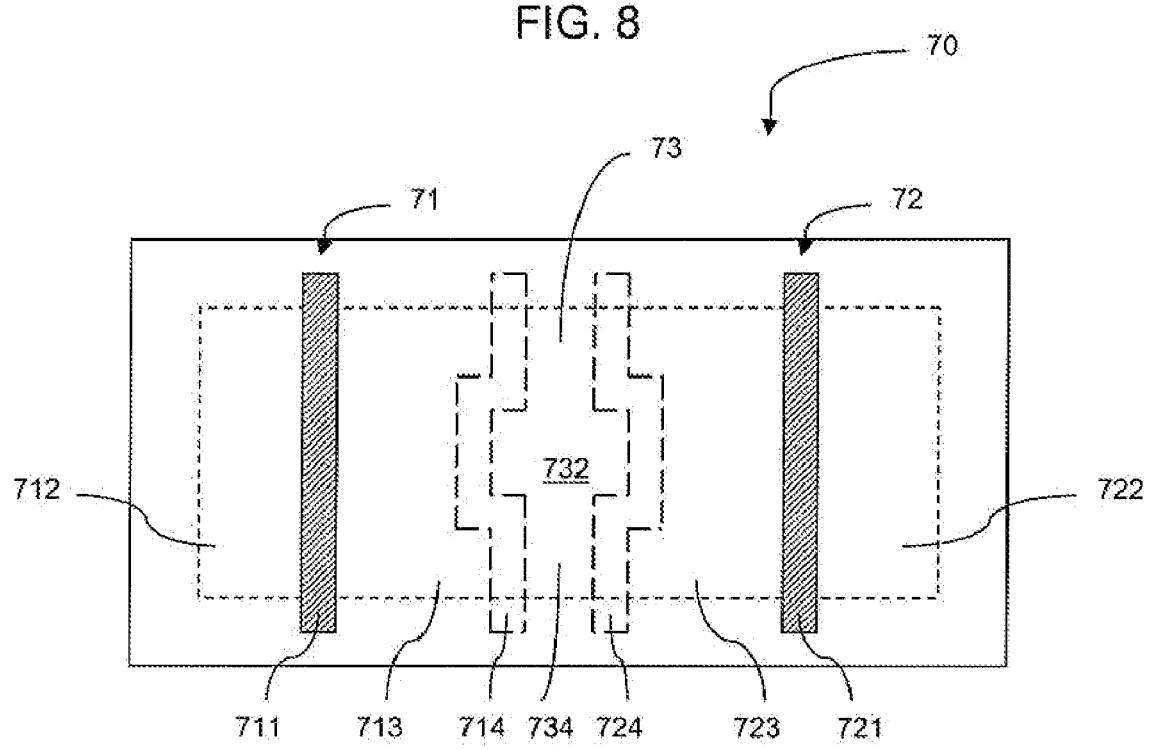
FIG. 9 illustrates a top view of a bipolar device according to another embodiment of the invention.

FIG. 9 illustrates another embodiment of the present invention, wherein two bipolar devices are combined together as a single device. The bipolar device 70 includes a first bipolar device 71 and the second bipolar device 72. The first poly gate 711 separates the first emitter 712 and the first collector 713. The second poly gate 721 separates the second emitter 722 and the second collector 723. The first transistor 71 and second transistor 72 share the same extrinsic base 73, which is defined by the first divider 714 and second divider 724. The middle portion 732 of the extrinsic base 73 is closer to the first poly gate 711 and second poly gate 721 than its edge portions 734. This preferred embodiment makes the bipolar devices more compact, due to the shared extrinsic base. The "saddle" shaped divider allows better arrangement of the collector/base contacts. This so-called double-base structure can further reduce the base resistance and increase the emitter efficiency.

Figure 10:
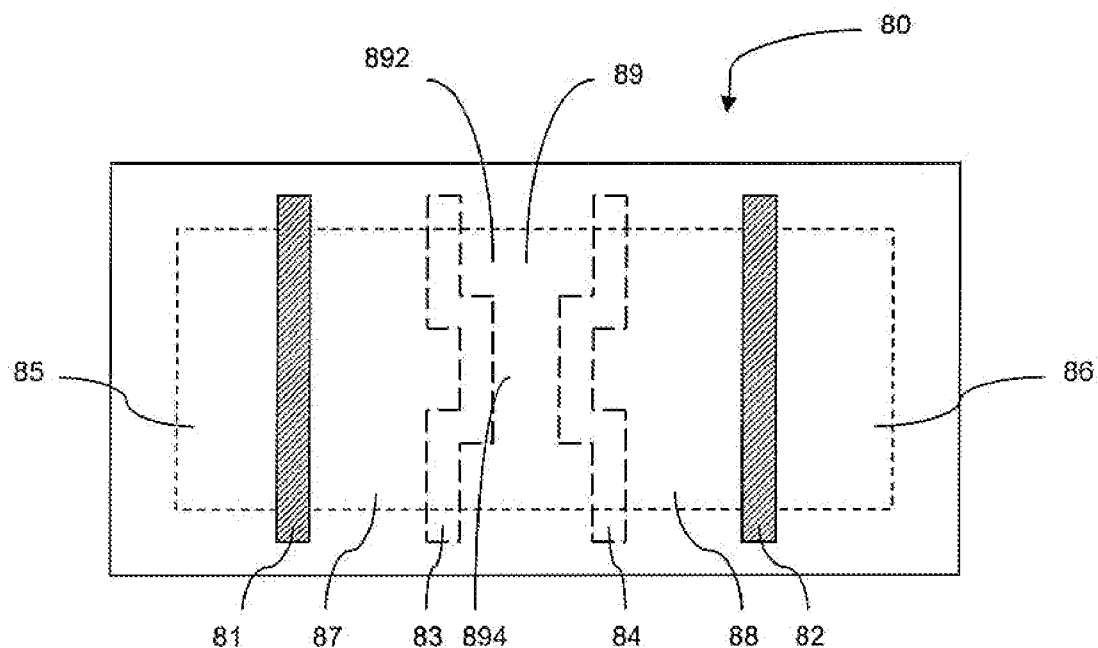
FIG. 10 illustrates a top view of a bipolar device according to another embodiment of the invention.

FIG. 10 illustrates a bipolar device 80 according to another preferred embodiment of the present invention. The poly gates 81, 82 and two dividers 83, 84 define the first emitter 85, second emitter 86, first collector 87, second collector 88 and shared extrinsic base 89. The bipolar device 80 differs from the bipolar device 70 as shown in FIG. 9 in that the edge portions 892 of the shared extrinsic base 89 are closer to the poly gates 81, 82 than its middle portion 894 so that the extrinsic base and the collector contacts can be placed on both ends and in the middle respectively. This embodiment also has the advantages of reduced base resistance, improved emitter efficiency and compact configuration.

Figure 11:
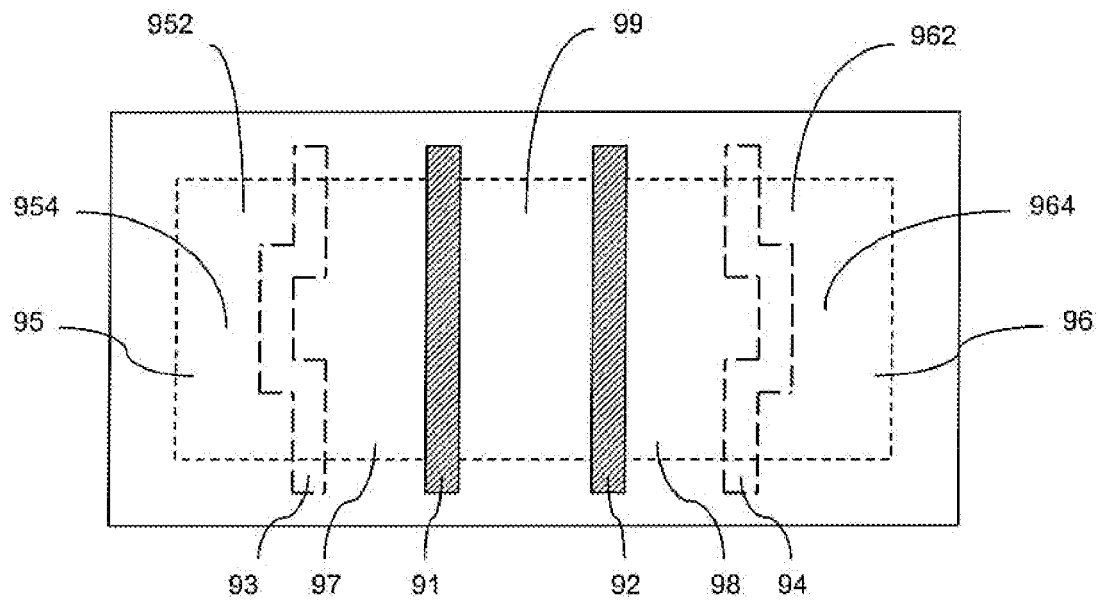
FIG. 11 illustrates a top view of a bipolar device according to another embodiment of the invention.

Referring to FIG. 11, according to another embodiment, two disclosed bipolar devices are combined together in an emitter-to-emitter (or a common emitter) configuration. The poly gates 91, 92 and dividers 93, 94 define the first extrinsic base 95, second extrinsic base 96, first collector 97, second collector 98 and shared emitter 99. The edge portions 952, 962 of the extrinsic bases 95 and 96 are closer to the poly gates 91 and 92, respectively, than their middle portions 954, 964.

Figure 12:
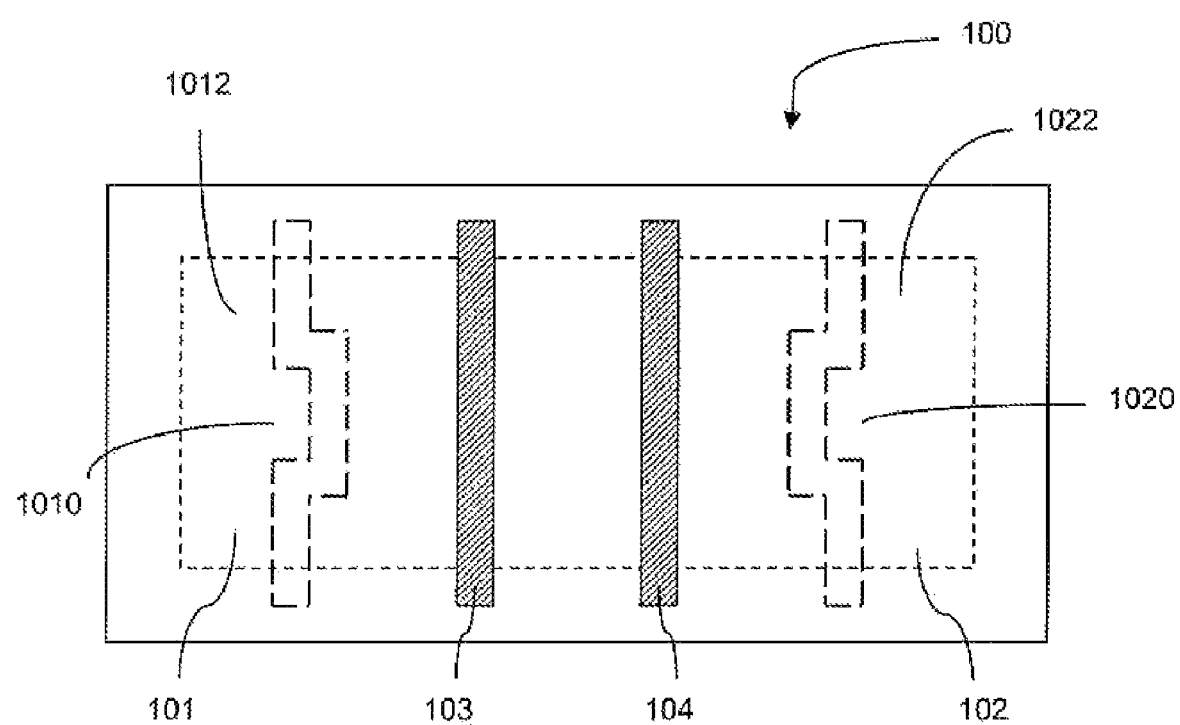
FIG. 12 illustrates a top view of a bipolar device according to another embodiment of the invention.

FIG. 12 illustrates another embodiment of the present invention, wherein the structure of the bipolar device 100 is substantially the same as the bipolar device as shown in FIG. 11, except that the middle portions 1010, 1020 of the extrinsic bases 101 and 102 are closer to the poly gates 103 and 104 than their edge portions 1012, 1022. The bipolar devices illustrated in FIGS. 11 and 12 also have the advantages of reduced base resistance, improved emitter efficiency and compact configuration.

Note that while the above embodiments use PNP bipolar devices to explain the spirit of the invention, the same ideas can be applied to NPN bipolar devices and still achieve as good advantages, like compatibility with CMOS technology, improved device performance, simplicity of manufacturing, compact structures, and additional modulating terminals.

The above invention provides many different embodiments, or examples, for implementing different features of the invention. Specific examples of components, and processes are described to help clarify the invention. These are, of course, merely examples and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. A bipolar device formed in an active area of a substrate, comprising:
   a first emitter formed in the substrate;
   a first collector laterally spaced from the first emitter in the substrate;
   a first gate terminal placed above a space between the first emitter and the first collector;
   a first intrinsic base defined underneath the first gate terminal, forming a first bipolar junction with the first emitter and the first collector;
   a second emitter formed in the substrate;
   a second collector laterally spaced from the second emitter in the substrate;
   a second gate terminal placed above a space between the second emitter and the second collector;
   a second intrinsic base defined underneath the second gate terminal, forming a second bipolar junction with the second emitter and the second collector; and
   a common extrinsic base placed adjacent to and separated from the first collector and the second collector, and connected to the first intrinsic base and the second intrinsic base via the substrate.

2. The bipolar device of claim 1 further comprising a first divider and a second divider separating the first collector and the second collector from the common extrinsic base, respectively.

3. The bipolar device of claim 2 wherein the first divider and the second divider are configured to define the common extrinsic base to have a middle portion and at least two edge portions in such a way that the middle portion is closer to the first gate terminal and the second gate terminal than the edge portions.

4. The bipolar device of claim 2 wherein the first divider and the second divider are configured to define the common extrinsic base to have a middle portion and at least two edge portions in such a way that the edge portions are closer to the first gate terminal and the second gate terminal than the middle portion.

5. The bipolar device of claim 1 wherein the divider is a blocking layer to block silicide formation.

6. The bipolar device of claim 1 wherein the divider is a dummy gate.

7. The bipolar device of claim 1 wherein a voltage at the first or second gate terminal is controlled in addition to the common extrinsic base to influence a current flowing between the respective emitter and the collector.

* * * * *